United States Patent [19]

Lee

[11] Patent Number: 5,657,282
[45] Date of Patent: Aug. 12, 1997

[54] SEMICONDUCTOR MEMORY DEVICE WITH STRESS CIRCUIT AND METHOD FOR SUPPLYING A STRESS VOLTAGE THEREOF

[75] Inventor: Kyu-Chan Lee, Seoul, Rep. of Korea

[73] Assignee: Samsung Electronics Co., Ltd., Suwon, Rep. of Korea

[21] Appl. No.: 400,995

[22] Filed: Mar. 9, 1995

[30] Foreign Application Priority Data

Mar. 10, 1994 [KR] Rep. of Korea ............... 4690-1994

[51] Int. Cl.$^6$ ............................................. G11C 29/00
[52] U.S. Cl. .......................... 365/201; 365/194; 365/196
[58] Field of Search ............................... 365/201, 194, 365/196

[56] References Cited

U.S. PATENT DOCUMENTS

| | | | |
|---|---|---|---|
| 4,527,254 | 7/1985 | Ryan et al. | 365/51 |
| 5,119,337 | 6/1992 | Shimizu et al. | 365/201 |
| 5,255,230 | 10/1993 | Chan et al. | 365/201 |
| 5,258,954 | 11/1993 | Furuyama | 365/201 |
| 5,412,331 | 5/1995 | Jun et al. | 326/105 |

FOREIGN PATENT DOCUMENTS 0480752  4/1992  Japan.

1992-21849  11/1992  Rep. of Korea.

*Primary Examiner*—David C. Nelms
*Assistant Examiner*—Andrew Q. Tran
*Attorney, Agent, or Firm*—Cushman Darby & Cushman, IP Group of Pillsbury Madison & Sutro LLP

[57] ABSTRACT

A semiconductor integrated circuit with a stress circuit and a stress voltage supplying method thereof ensures the reliability of the device. The semiconductor integrated circuit has a stress enable circuit for generating an enable signal during a test operation of the chip and for enabling the test operation, a stress voltage supplying circuit for supplying a first stress voltage and a second stress voltage in response to an output signal of the stress enable circuit during the test operation, and a sensing delay control circuit for receiving the first and second stress voltages and for delaying an operation of the sense amp control circuit during the test operation. During the test operation, the first and second stress voltages are supplied to word lines adjacent to each other in response to the output signal of the stress enable circuit, and a state of a selected memory cell by the word line is sensed in response to an output signal of the sensing delay control circuit.

20 Claims, 5 Drawing Sheets

SEMICONDUCTOR MEMORY DEVICE WITH STRESS CIRCUIT AND METHOD FOR SUPPLYING A STRESS VOLTAGE THEREOF

BACKGROUND OF THE INVENTION

1. Field of the Invention

The present invention relates to a semiconductor memory device, and more particularly, to a semiconductor memory device with a stress circuit and a stress voltage supplying method thereof which ensures the reliability of the device.

2. Description of the Related Art

With increasing integrations of semiconductor circuits, plane and vertical reductions in size are demanded. Cell structures for storing data are more scaled down and it is important to ensure their reliability because of the complicated processes required to produce minute patterns, sufficient step coverages, etc. In a semiconductor memory such as a dynamic RAM or a static RAM, a burn-in test is executed to examine the reliability of their internal circuits before or after a chip packaging process. To execute the burn-in test, a stress circuit for supplying a stress voltage is needed and this stress circuit is generally contained in test equipment. The burn-in test detects defects of memory cells in the chip or tests their integrity. Whether or not defects exist is determined by supplying an external supply voltage or higher voltage to each memory cell for a long time. Burn-in tests are used by all semiconductor manufacturing companies and constant efforts are made to develop effective burn-in tests. On the other hand, with the increasing integration of semiconductor memories, the test times therefore are increased in proportion thereto. In a 1M (Mega=$2^{20}$) bit-class or less semiconductor memory device, test times do not effect the completion of the entire chip. However, in a 64M or 256M bit-class semiconductor memory device, the test time lengthens in accordance with an increase in the number of memory cells, causing an increase in chip manufacturing time. Consequently, the unit cost of production rises and it takes much time to manufacture products.

U.S. Pat. No. 5,119,337, issued Jun. 2, 1992 to Mitsuru Shimizu et al., entitled "SEMICONDUCTOR MEMORY DEVICE HAVING BURN-IN TEST FUNCTION" discloses techniques for improving the reliability of detecting defective memory cells by sufficiently raising a voltage level supplied to word lines during the burn-in test of dynamic RAMs in a package state. The techniques disclosed in the above patent have an advantage in that the test reliability is improved for the package state of the chip.

To test the chip in the package state, a method for applying stress to hundreds or thousands of packaged devices at high temperatures of about 125° C. and high power voltages of 7 V or more has generally been used. In the method with such test conditions, micro defects such as defects in a gate oxide layer, capacitor oxide layer, metal bridge and poly bridge etc. can be screened. When the stress is applied, all the cells are scanned while writing data of a uniform pattern in the cell. The stress applied to each cell has a refresh period in a dynamic RAM operation. If the refresh period is 1024 refresh cycles for example, stress is put on a corresponding word line by the period of 1024 row address strobe $\overline{RAS}$ cycles when a row address is sequentially increased. Assuming that the stress time is 48 hours, stress is actually applied to the cell for not 48 hours but 48/1024 hours. Therefore, the stress time applied per cell is not enough. However, if the stress time is increased, the time to complete the chip is also increased.

SUMMARY OF THE INVENTION

It is therefore an object of the invention to provide a semiconductor integrated circuit which ensures the reliability of a device.

It is another object of the invention to provide a semiconductor integrated circuit which simultaneously applies stress on all the cells of a chip.

It is another object of the invention to provide a semiconductor integrated circuit for supplying a stress voltage of different levels to adjacent word lines in a chip.

It is another object of the invention to provide a semiconductor integrated circuit which effectively applies stress on cells irrespective of a wafer state or a package state of the chip.

It is another object of the invention to provide a stress voltage supplying method of a semiconductor integrated circuit for ensuring the reliability of a device.

It is another object of the invention to provide a stress voltage supplying method of a semiconductor integrated circuit which effectively applies stress on a cell by reducing the time required to apply stress on all the cells in a chip.

It is another object of the invention to provide a stress voltage supplying method of a semiconductor integrated circuit simultaneously applies stress on all the cells in a chip.

It is another object of the invention to provide a stress voltage supplying method of a semiconductor integrated circuit for supplying a stress voltage of different levels to adjacent word lines in a chip.

It is another object of the invention to provide a stress voltage supplying method of a semiconductor integrated circuit which effectively applies stress on cells in a chip irrespective of a wafer state or a package state of the chip.

It is another object of the invention to provide a stress voltage supplying method of a semiconductor integrated circuit for effectively performing defect analysis in a wafer state.

To attain the above objects, the present invention is directed to a semiconductor integrated circuit which has a stress circuit and detects defects irrespective of a wafer state or a package state of a chip.

In accordance with one aspect of the invention, a semiconductor integrated circuit has a stress enable circuit for generating an enable signal during a test operation of the chip and for enabling the test operation, a stress voltage supplying circuit for supplying a first stress voltage and a second stress voltage in response to an output signal of the stress enable circuit during the test operation, and a sensing delay control circuit for receiving the first and second stress voltages and for delaying an operation of the sense amp control circuit during the test operation. During the test operation, the first and second stress voltages are supplied to adjacent word lines in response to the output signal of the stress enable circuit, and a state of a memory cell selected by the word line is sensed in response to an output signal of the sensing delay control circuit.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, and wherein.

DETAILED DESCRIPTION OF THE PREFERRED EMBODIMENT

In the following description, numerous specific details of such features as a φSSD generating circuit, a sense amp control circuit, a φDPX generating circuit, a φX reset circuit, a decoding unit, etc. are set forth to provide a more thorough understanding of the invention. It will be apparent, however, to one skilled in the art that the invention may be practiced without these specific details.

Figure 1A:
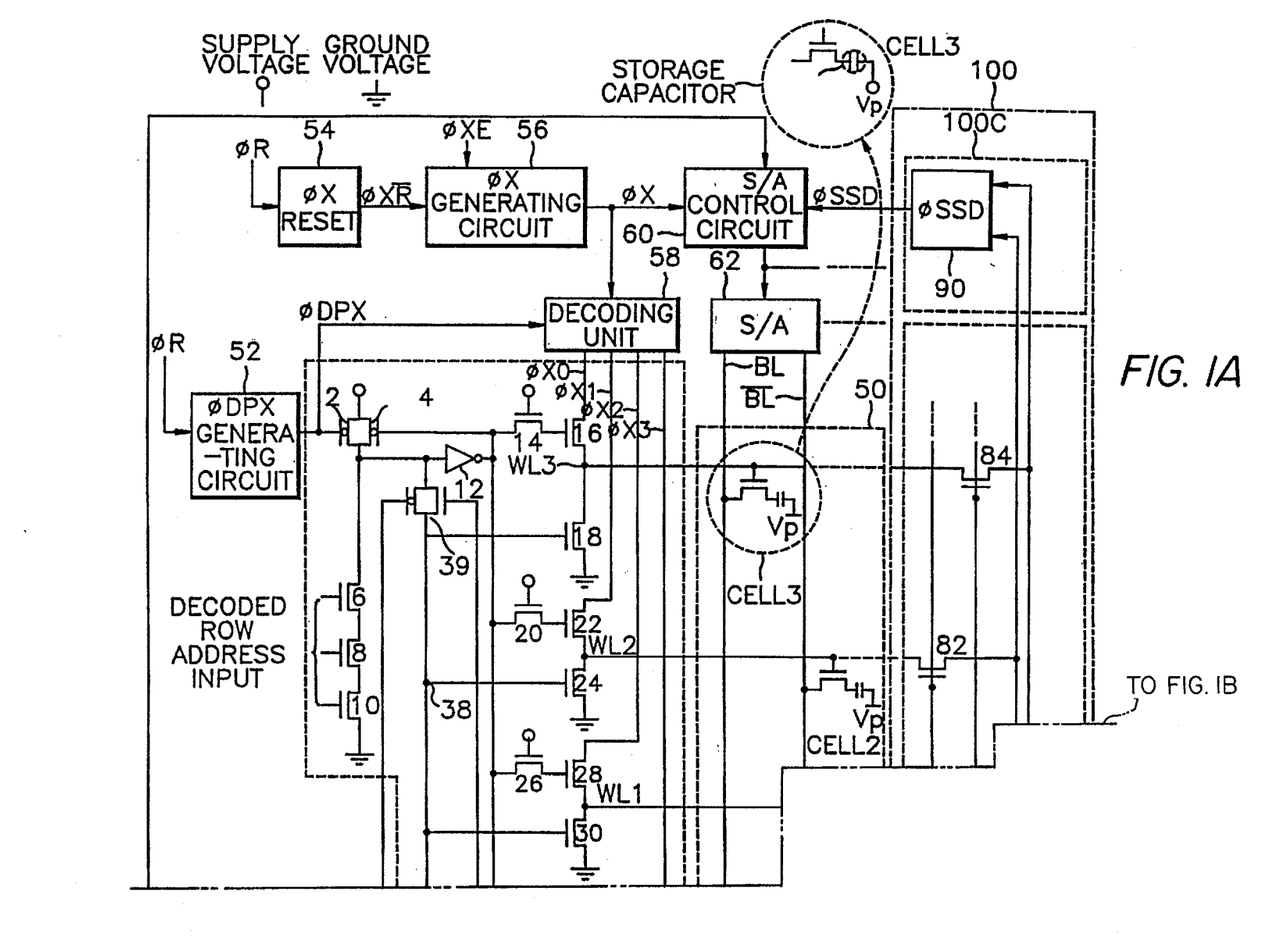
FIGS. 1A and 1B are schematic diagrams showing a portion of a semiconductor integrated circuit having a stress circuit according to the present invention.
Figure 1B:
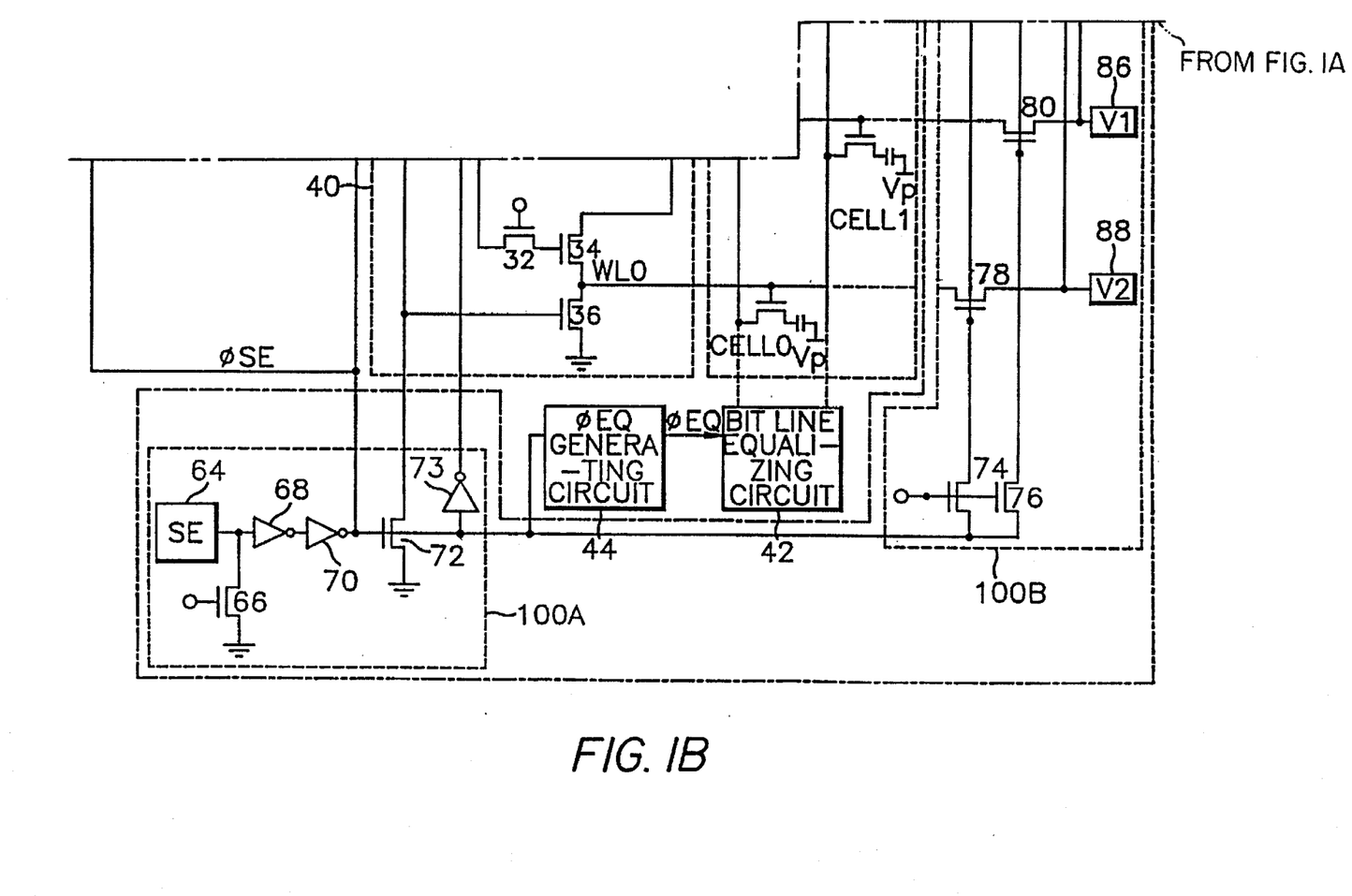

FIG. 1 shows a schematic internal construction of a semiconductor integrated circuit having a stress circuit. In connection with a memory cell, there are a plurality of row related decoding circuits and column related sensing circuits on the same chip in proportion to the degree of integration of the chip. A row decoder 40 has a general circuit structure, such as a word line driving circuit, disclosed in, for example, Korea Patent Application No. 1992-20343, filed Oct. 31, 1992 or 1992-21849, filed Nov. 20, 1991, assigned to the same assignee as the present invention. Addressing of decoded row addresses applied to the row decoder 40 may use a process such as the above word line driving circuit. However, it should be noted that transmission gate 39 controlled by stress circuit 100 and the control process thereof are constructed according to the present invention. The above patent applications teach decoding row addresses using as inputs the combination of addresses, that is, DRAkl, DRAmn and DRApq. If these decoded row addresses DRAkl, DRAmn and DRApq of logic "high" are supplied, connection node 38 is lowered to a logic "low" level and inverter 12 generates a logic "high" level signal, thereby selecting a word line. A memory cell array 50 is a typical dynamic RAM cell array with memory cells each consisting of one access transistor and one storage capacitor. The stress circuit embodying the present invention is designated by a block 100 and other row and column related decoding circuits are operated by output information of the stress circuit 100.

The stress circuit 100 includes a stress enable (SE) terminal 64, a first stress voltage (V1) supplying terminal 86 and a second stress voltage (V2) supplying terminal 88. These terminals may be attained as follows. First, external pins may be used. For this, 3 external pins should be added to the chip. Then the desired stress voltage can be applied to the chip irrespective of a wafer state or package state of the chip. Second, a pad may be used. Since there is no need to supply additional pins, this method is capable of conforming to the JEDEC format currently used to standardize semiconductor integrated circuits. The stress circuit 100 consists of a stress enable circuit 100A, a stress voltage supplying circuit 100B and a sensing delay control circuit 100C.

The stress enable circuit 100A has the SE terminal 64 for enabling a stress operation, a driver circuit consisting of inverters 68 and 70 for amplifying the output signal of the SE terminal 64 and for generating a stress enable signal φSE, an NMOS transistor 72 for receiving by its gate the stress enable signal φSE and for lowering the connection node 38 to logic "low" in response thereto, and an inverter 73 for receiving the stress enable signal φSE and for generating an inverted stress enable signal φ$\overline{SE}$. An NMOS transistor 66 formed on the output line of the SE terminal 64 serves as a resistor.

The voltage supplying circuit 100B includes the V1 supplying terminal 86 and the V2 supplying terminal 88. Transfer transistors 78 and 80 supply second and first stress voltages V2 and V1 generated from the V2 and V1 supplying terminals 88 and 86 to word lines WL0 and WL1, respectively. Transfer transistors 82 and 84 supply the stress voltages V2 and V1 generated from the V2 and V1 supplying terminals 88 and 86 to word lines WL2 and WL3, respectively. An NMOS transistor 74 supplies the stress enable signal φSE to the gates of transfer transistors 78 and 82. An NMOS transistor 76 supplies the stress enable signal φSE to gates of transfer transistors 80 and 84.

The sensing delay control circuit 100C has delay control signal (φSSD) generating circuit 90 for delaying a sensing operation of sense amp (S/A) control circuit 60 which drives the sensing operation of sense amp (S/A) 62 during a stress operation. The structure and operation of the φSSD generating circuit 90 will be described with reference to FIG. 3. Meanwhile, the p-type control terminal of transmission gate 39 of row decoder 40 is controlled by the stress enable signal φSE and the n-type control terminal thereof is controlled by the inverted stress enable signal φ$\overline{SE}$.

Figure 2:
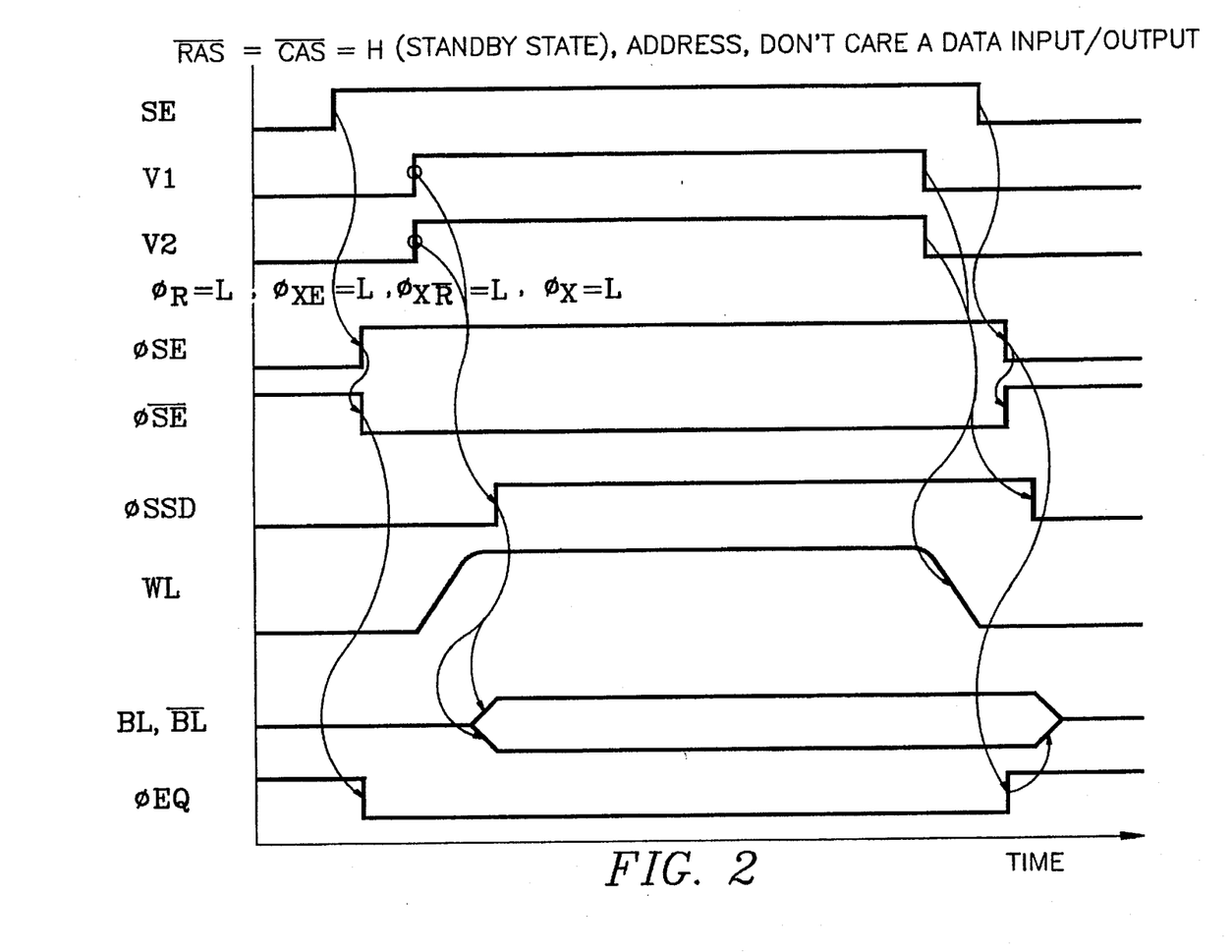
FIG. 2 is a timing chart showing an operation of each signal of FIG. 1 during a stress mode.

FIG. 2 is a timing chart showing an operation of each signal of FIG. 1 during a stress mode. It is assumed that if the stress voltage is supplied, the stress enable signal φSE is enabled to logic "high". When the chip is not undergoing a stress mode operation, that is, during a typical normal operation, the stress enable signal φSE from the stress enable circuit 100A of FIG. 1 is lowered to logic "low". Row decoder precharge signal (φDPX) generating circuit 52, which is a precharge control circuit of the row decoder 40, φX reset circuit 54, decoding unit 58, which generates a word line boosting signal, and sense amp control circuit 60, together implement a typical decoding operation. NMOS transistors 74 and 76 are turned off and transfer transistors 78, 80, 82 and 84 also are turned off, thereby insulating the V1 and V2 supplying terminals 86 and 88 from the word lines WL1 and WL2, respectively.

For the stress mode operation, if the stress enable signal φSE is enabled to logic "high", NMOS transistor 72 is turned on and connection node 38 is lowered to logic "low". NMOS transistors 18, 24, 30, and 36, which are pull-down transistors of the word line driving circuit, are turned off and transfer transistors 78, 80, 82 and 84 are turned on, thereby forming a current path between the V1 supplying terminal 86 and the corresponding word line and between the V2 supplying terminal 88 and the corresponding word line. Since voltages of different levels can be supplied to the V1 and V2 supplying terminals 86 and 88, the different voltages can be supplied to the corresponding word lines. That is, the different voltages are supplied to the word lines WL0 and WL1. Likewise, the different voltages are supplied to WL2 and WL3. NMOS transistors 16, 22, 28 and 34, which are pull-up transistors of the word line driving circuit, and NMOS transistors 18, 24, 30 and 36, which are pull-down transistors, are turned off by the signal conditions shown in FIG. 2. Hence, V1 and V2 supplied to the word lines is prevented from discharging. Meanwhile, the sense amp control circuit 60 receives the output signal φSSD from the φSSD generating circuit 90 serving as a delay circuit so as to enable performance of a sensing operation after the word line is sufficiently raised to logic "high" corresponding to the voltage level supplied when writing a uniform data pattern into the memory cell.

The operation of supplying voltages of different levels to adjacent word lines will now be described. For instance, when "1" is written in the memory cell connected to a bit line BL and "0" is written in the memory cell connected to a bit line $\overline{BL}$, if a logic "high" voltage is applied to the V1 supplying terminal 86 and a logic "low" voltage is applied to the V2 supplying terminal 88, adjacent word lines will have different voltages. Therefore, stress can be applied so as to develop different voltages between adjacent bit lines and between adjacent word lines.

Each memory cell of the cell array 50 has a general dynamic RAM cell structure consisting of one access transistor and one storage capacitor, as indicated by encircled dotted line of a cell 3. The storage capacitor is generally referred to as a storage poly since it is formed of polycrystalline silicon. In a 64M or 256M bit-class dynamic RAM of very large scale integration, memory cells are designed using very free design-role techniques such that the interval between cells is extremely narrow. Moreover, if a stack process is used, since a storage node of cell 0 is adjacent to that of cell 1, stress can be applied between the storage poly having a great step and the storage poly adjacent thereto. Further, if different voltages are supplied to bit lines BL and $\overline{BL}$ and a logic "high" voltage is supplied to the V1 and V2 supplying terminals 86 and 88, stress can be applied on the gate oxide layer of the access transistor and the oxide layer of the storage capacitor of the memory cell. Thus, adjacent word lines and adjacent bit lines are controlled so as to have a desired voltage level and all defects which may occur during the fabrication process can be screened.

In a conventional stress voltage supplying method, any voltage is supplied to the word line or bit line. According to the present invention, voltages of different levels as well as the same voltage can be supplied to adjacent lines or nodes of the memory cell. Therefore, stress can be applied to a microbridge, which may occur in tight design-role dynamic RAM cells, such as between word lines, bit lines, storage polys, etc. If such a method is used in a wafer level test, since these defects can still be repaired, production yields are raised and stress time required in a package process is greatly reduced.

Figure 3:
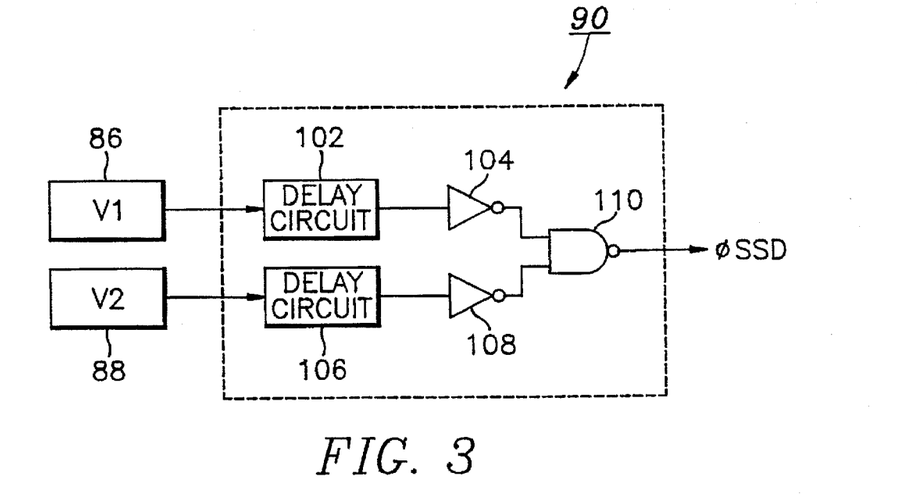
FIG. 3 is a circuit diagram showing a sensing delay control signal (φSSD) generating circuit of FIG. 1.

FIG. 3 illustrates the φSSD generating circuit 90 of FIG. 1 according to the present invention. A first delay circuit 102 has its input terminal connected to V1 supplying terminal 86. Inverter 104 receives the output signal of first delay circuit 102. A second delay circuit 106 has its input terminal connected to V2 supplying terminal 88. Inverter 108 receives the output signal from the second delay circuit 106. A NAND gate 110 receives the outputs of the inverters 104 and 108 and generates a sensing delay control signal φSSD controlling the delay operation of the sense amp control circuit 60. The delay circuits 102 and 106 may be constructed with a CMOS inverter chain, a resistor or a capacitor, or may be constructed with a word line tracking circuit and a Schmitt trigger circuit operated in response to the output signal of this word line tracking circuit. If a voltage is supplied to either the V1 or V2 supplying terminal 86 or 88, that is, during a test operation, the delay signal φSSD is generated. It should be noted that the delay circuits 102 and 106 ensure time to sufficiently perform a charge sharing operation until the word line is sufficiently raised to a logic "high" level by delaying the supply of first and second stress voltages V1 and V2, since during the stress mode, the sensing operation is implemented after writing data in the cell as shown in FIG. 2.

Figure 4:
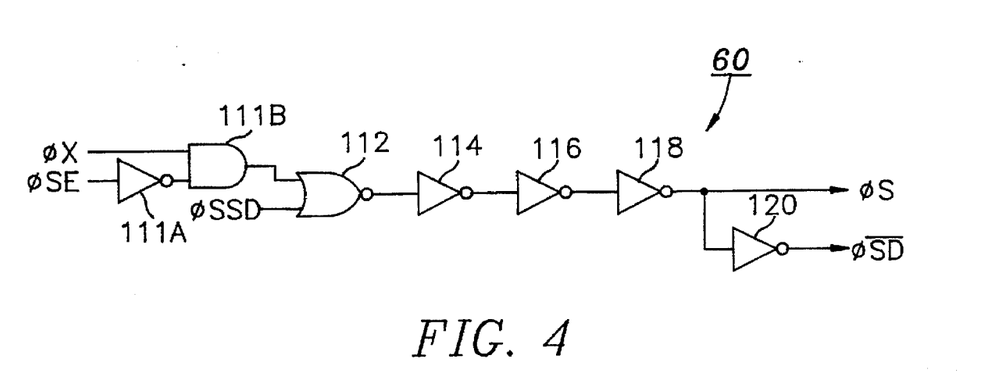
FIG. 4 is a circuit diagram showing a sense amp control circuit of FIG. 1.

FIG. 4 illustrates the sense amp control circuit 60 of FIG. 1 according to the present invention. An AND gate 111B receives the output signal φX of a φX generating circuit 56 of FIG. 1 and receives the inverted stress enable signal φ$\overline{SE}$ supplied via an inverter 111A. A NOR gate 112 receives the output signal of the AND gate 111B and the output signal φSSD of the φSSD generating circuit 90. Inverters 114 and 116 are serially connected to the output terminal of the NOR gate 112. An inverter 118 receives the output signal of the inverter 116 and generates a driving signal φS for sense amp 62. An inverter 120 receives the output signal of the inverter 118 and generates a driving signal φ$\overline{SD}$ for sense amp 62. The output signals φS and φ$\overline{SD}$ are signals for driving the differential amplifiers comprised with a P-type sensing amplifier and an N-type amplifier. The signal φS can be used for driving the P-type sensing amplifier and the signal φ$\overline{SD}$ for the N-type sensing amplifier. During the test operation, the sense amp control circuit 60 is driven by the control of the sensing delay control signal φSSD supplied to its input terminal.

Figure 5:
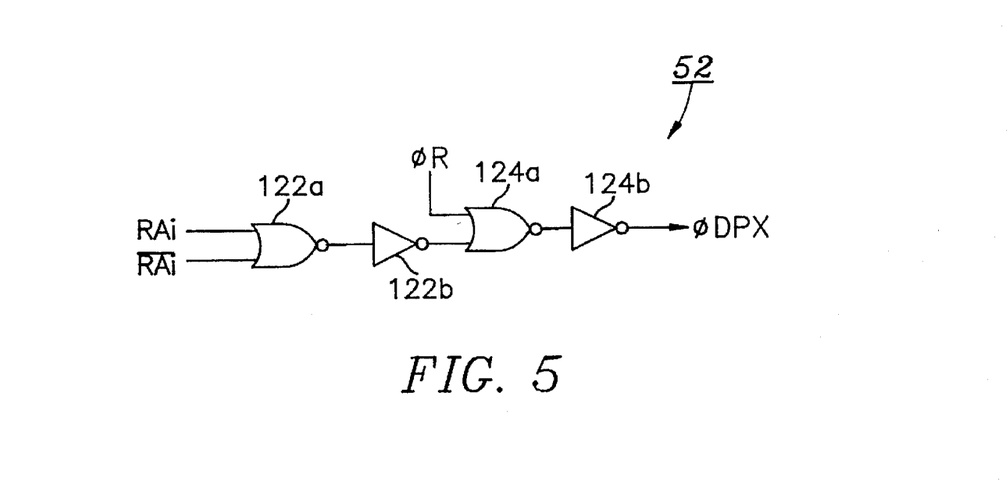
FIG. 5 is a circuit diagram showing a row decoder precharge signal (φDPX) generating circuit of FIG. 1.

The φDPX generating circuit 52 of FIG. 1 is illustrated in FIG. 5 and shows a well known circuit construction. FIG. 5 is comprised of a NOR gate 122a for compounding the row addresses RAi and $\overline{RAi}$, an inverter 122b for inverting an output of the NOR gate 122a, a NOR gate 124a for compounding and outputting a master clock φR of the row address strobe signal $\overline{RAS}$ and the output of the inverter 122b, and an inverter 124b for generating a row decoder precharge clock signal φDPX (Row Decoder Precharge Clock) by inverting the output of the NOR gate 124a. The φDPX generating circuit 52 outputs the signal φDPX set to the "low" level except during the standby mode and during stress mode normal read/write operations.

Figure 6:
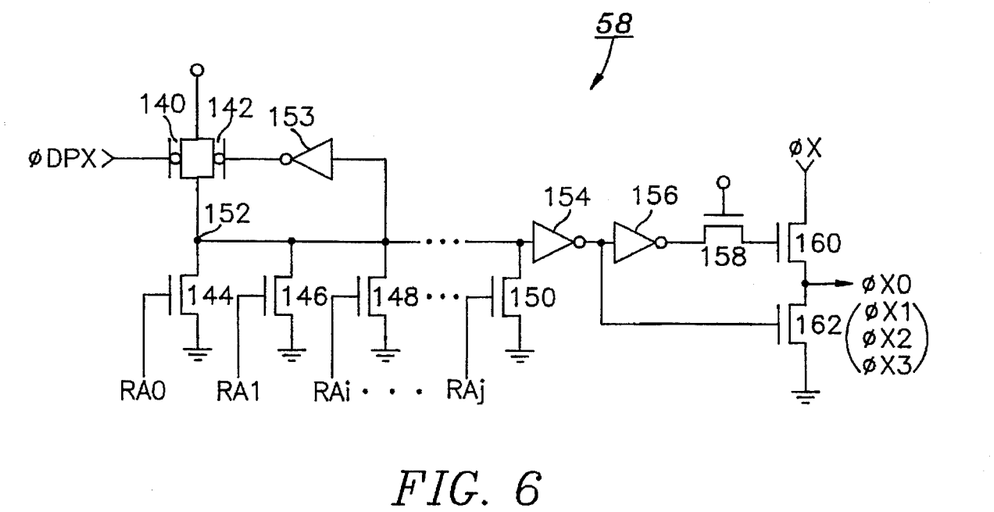
FIG. 6 is a circuit diagram showing a decoding unit of FIG. 1.

The decoding unit 58 of FIG. 1 is illustrated in FIG. 6 and shows a general circuit construction. Four decoding units are contained in the decoding unit 58 of FIG. 1 and four boosting signals φX0, φX1, φX2 and φX3 are generated therethrough. Row addresses RAi, . . . , RAj are block select related signals.

Figure 7:
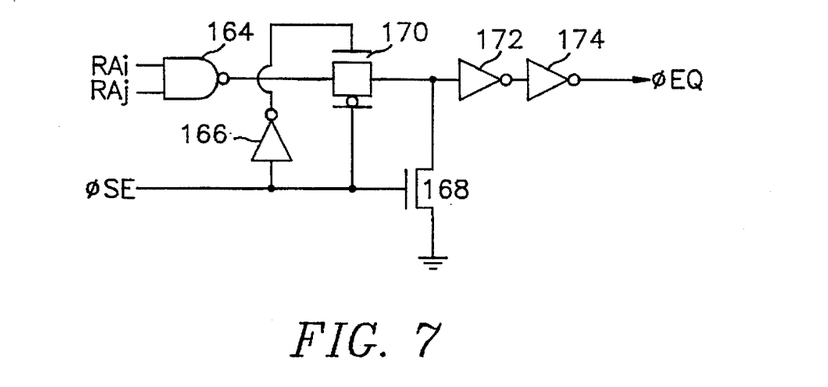
FIG. 7 is a circuit diagram showing a bit line equalizing control signal (φEQ) generating circuit of FIG. 1.

FIG. 7 illustrates a φEQ generating circuit 44 of FIG. 1 according to the present invention. The φEQ generating circuit 44 cuts off an equalizing operation of the bit line during the stress operation. A NAND gate 164 receives the block select addresses RAi and RAj. A transmission gate 170 formed on a line for transmitting the output signal of the NAND gate 164 performs a switching operation under control of the stress enable signal φSE. An amplifying circuit consisting of inverters 172 and 174 amplifies the output signal of the NAND gate 164 generated through the transmission gate 170. NMOS transistor 168 with its channel connected between an input node of the amplifying circuit and a ground voltage performs a switching operation under control of the stress enable signal φSE. During normal read/write operations, since the stress enable signal φSE of logic "low" is applied, the transmission gate 170 is turned on at all times. During the stress operation, the stress enable signal φSE of logic "high" is applied and NMOS transistor 168 is mined on, thereby lowering the input voltage of inverter 172 to logic "low". Thus a bit line equalizing control signal φEQ is lowered to logic "low" and the equalizing operation of the bit line is cut off.

It will be readily appreciated to those skilled in the art that different valid voltages may be supplied to adjacent bit lines or word lines.

As described above, all defects which may occur in a manufacturing process of the memory cell can be screened.

Even if multiple defects occur on the same chip, the defects are easily detected in the wafer level and usefully analyzed. Further, an effective test is implemented by supplying different voltages to adjacent word lines or bit lines testing operation. By testing in the wafer state, production yields can be increased and by testing in the package state, stress times can be greatly reduced.

The present invention in its varying facets has been described in general and shown by way of a preferred embodiment. It should be understood that the fundamental concepts upon which the invention is based are broader than the specific embodiment shown and described herein. For instance, the structure of the stress circuit 100 of FIG. 1 may be altered. In like manner, the decoding and sensing related circuits of FIG. 1 may be altered on the basis of the stress voltage supplying method used and the construction employed for receiving the stress related signal.

What is claimed is:

1. A semiconductor memory circuit comprising:

a first stress voltage supplying terminal that supplies a first stress voltage and is coupled to a first word line;

a second stress voltage supplying terminal that supplies a second stress voltage and is coupled to a second word line adjacent to said first word line; and a stress enable circuit that controls the supply of said first and second stress voltages to said first and second word lines such that said first and second stress voltages having different voltage levels are respectively supplied to said first and second word lines during a test operation.

2. The semiconductor memory circuit as set forth in claim 1, wherein said first and second stress voltage supplying terminals are coupled to external pins such that said first and second stress voltages are applied from an external source in a package state of said semiconductor memory circuit.

3. The semiconductor memory circuit as set forth in claim 1, wherein said first and second stress voltage supplying terminals are coupled to pads to which said first and second stress voltages are applied in a wafer state of said semiconductor memory circuit.

4. The semiconductor memory circuit as set forth in claim 1, wherein said first and second stress voltage supplying terminals respectively supply said first and second stress voltages to said first and second word lines simultaneously.

5. A semiconductor memory circuit having a pair of bit lines, and a sense amplifier for performing a sensing operation on said bit lines in response to a sensing control signal, said semiconductor memory circuit comprising:

a first stress voltage supply terminal that supplies a first stress voltage and is coupled to a first word line;

a second stress voltage supply terminal that supplies a second stress voltage and is coupled to a second word line adjoining said first word line;

delay means, coupled to said first and second stress voltage supply terminals, for generating a delay signal which is delayed by a predetermined time after at least one of said first and second stress voltages is applied to said word lines from said first and second stress voltage supply terminals;

sense amplifier control means for supplying said sensing control signal to said sense amplifier in response to said delay signal, such that said sense amplifier performs said sensing operation on said bit lines after receipt of said delay signal so that data in a memory cell coupled to said bit lines is sufficiently transferred to said bit lines in a stress mode operation.

6. The semiconductor memory circuit as set forth in claim 2, wherein said first and second stress voltage supply terminals are coupled to external pins such that said first and second stress voltages are applied from an external source in a package state of said semiconductor memory circuit.

7. The semiconductor memory circuit as set forth in claim 2, wherein said first and second stress voltage supplying terminals are coupled to pads to which said first and second stress voltages are applied in a wafer state of said semiconductor memory circuit.

8. A semiconductor memory circuit having a memory cell, a bit line for sensing data of said memory cell, a sense amplifier for performing a sensing operation on said bit line, a sense amplifier control circuit for driving said sensing operation of said sense amplifier and a row decoder for selecting said memory cell in response to an input of an address, said semiconductor memory circuit comprising:

a stress enable circuit that generates a stress enable signal during a test operation and enables said test operation;

a stress voltage supplying circuit coupled to said stress enable circuit, that supplies at least one of a first stress voltage and a second stress voltage in response to said stress enable signal of said stress enable circuit during said test operation; and a sensing delay control circuit coupled to said stress voltage supplying circuit, which, after receiving said at least one of said first and second stress voltages, causes said sense amplifier control circuit to delay driving said sensing operation of said sense amplifier during said test operation.

9. The semiconductor memory circuit as set forth in claim 8, wherein said stress enable circuit comprises:

a stress enable terminal that receives a signal indicating said test operation;

a driver circuit coupled to said stress enable terminal that amplifies said signal supplied from said stress enable terminal and generates said stress enable signal; and a pull-down transistor having a gate coupled to said driver circuit, that receives said stress enable signal and controls a discharge path of said row decoder such that said first and second stress voltages respectively supplied to said first and second word lines is prevented from discharging during said test operation.

10. The semiconductor memory circuit as set forth in claim 9, wherein said stress voltage supplying circuit comprises:

a first stress voltage supplying terminal that generates said first stress voltage;

a second stress voltage supplying terminal that generates said second stress voltage;

a first transfer transistor coupled between said first stress voltage supplying terminal and a first word line that supplies said first stress voltage to said first word line;

a second transfer transistor coupled between said second stress voltage supplying terminal and a second word line that supplies said second stress voltage to said second word line; and a third transfer transistor that supplies said stress enable signal to each gate of said first and second transfer transistors.

11. The semiconductor memory circuit as set forth in claim 10, wherein said sensing delay control circuit comprises:

a first delay circuit that receives and delays said first stress voltage;

a second delay circuit that receives and delays said second stress voltage; and a logic circuit that receives outputs of said first and second delay circuits, and generates a logic signal to control a delay that prevents said sense amplifier control circuit from driving said sensing operation of said sense amplifier when either said first or second stress voltage is supplied.

12. The semiconductor memory circuit as set forth in claim 10, wherein said first and second stress voltage supplying terminals are coupled to external pins such that said first and second stress voltages are applied from an external source in a package state of said semiconductor memory circuit.

13. The semiconductor memory circuit as set forth in claim 10, wherein said first and second stress voltage supplying terminals are coupled to pads to which said first and second stress voltages are applied in a wafer state of said semiconductor memory circuit.

14. A method for supplying a stress voltage of a semiconductor memory circuit comprising:

supplying a first stress voltage to a first word line;

supplying a second stress voltage to a second word line adjacent to said first word line; and controlling the supply of said first and second stress voltages to said first and second word lines such that stress voltages of a different voltage level are respectively supplied to said first and second word lines during a test operation.

15. The method for supplying a stress voltage of a semiconductor memory circuit as set forth in claim 14, wherein said controlling step includes simultaneously supplying said first and second stress voltages to said first and second word lines, respectively.

16. A method for supplying a stress voltage of a semiconductor memory circuit having a memory cell, a bit line for sensing data of said memory cell, a sense amplifier for performing a sensing operation on said bit line and a sense amplifier control circuit for driving said sensing operation of said sense amplifier, said method comprising:

supplying a first stress voltage to a first word line;

supplying a second stress voltage to a second word line adjacent to said first word line; and logically combining detected voltage levels of said first and second stress voltages and delaying an operation of said sense amplifier control circuit in response to a received combination level such that during a test operation said sensing operation of said bit line is delayed until after said received combination level of said first and second stress voltages is respectively supplied to said first and second word lines so that a test of said memory cell is implemented.

17. A method for supplying a stress voltage of a semiconductor memory circuit having a memory cell, a bit line for sensing data of said memory cell, a sense amplifier for performing a sensing operation on said bit line, a sense amplifier control circuit for driving the sensing operation of said sense amplifier and a row decoder for selecting said memory cell in response to an input of an address, said method comprising:

generating an enable signal during a test operation and enabling said test operation;

supplying at least one of a first stress voltage and a second stress voltage in response to said enable signal during said test operation; and detecting the supply of said at least one of said first and second stress voltages and delaying an operation of said sense amplifier control circuit during said test operation such that during said test operation said first and second stress voltages are respectively supplied to word lines adjacent to each other in response to said enable signal and a state of a memory cell selected by said word line is sensed after a predetermined delay from said detected supply of said at least one of said first and second stress voltages.

18. The method for supplying a stress voltage of a semiconductor memory circuit as set forth in claim 17, wherein said enable signal generating step comprises:

detecting said test operation;

amplifying a signal supplied when said test operation is detected and generating said enable signal; and controlling a discharge path of said row decoder such that said first and second stress voltages respectively supplied to said adjacent word lines are prevented from discharging during said test operation.

19. The method for supplying a stress voltage of a semiconductor memory circuit as set forth in claim 18, wherein said stress voltage supplying step comprises:

generating said first stress voltage;

generating said second stress voltage;

supplying said first stress voltage to a first one of said adjacent word lines;

supplying said second stress voltage to a second one of said adjacent word lines; and receiving said enable signal and controlling the supply of said first and second stress voltages to said first and second word lines in response thereto.

20. The method for supplying a stress voltage of a semiconductor memory circuit as set forth in claim 19, wherein said sensing delay step comprises:

receiving and delaying said first stress voltage;

receiving and delaying said second stress voltage; and logically combining said delayed first and second stress voltages, and generating a signal for preventing said sense amplifier control circuit from driving said sensing operation of said sense amplifier when either said first or second stress voltage is supplied.

* * * * *